United States Patent
Kim

(10) Patent No.: US 8,022,407 B2
(45) Date of Patent: Sep. 20, 2011

(54) THIN FILM TRANSISTOR ARRAY SUBSTRATE AND MANUFACTURING METHOD THEREOF

(75) Inventor: Dong-Gyu Kim, Yongin-si (KR)

(73) Assignee: Samsung Electronics Co. Ltd., Suwon-Si, Gyeonggi-Do (KR)

(*) Notice: Subject to any disclaimer, the term of this patent is extended or adjusted under 35 U.S.C. 154(b) by 44 days.

(21) Appl. No.: 12/603,786

(22) Filed: Oct. 22, 2009

(65) Prior Publication Data

US 2010/0127265 A1    May 27, 2010

(30) Foreign Application Priority Data

Nov. 25, 2008 (KR) .......................... 10-2008-011757

(51) Int. Cl.
*H01L 29/786* (2006.01)

(52) U.S. Cl. ..... 257/59; 257/72; 257/291; 257/E21.414; 438/158; 349/43; 349/141

(58) Field of Classification Search .................. 257/59, 257/72, 291, E21.414, E29.291, E27.294; 438/158; 349/43, 151

See application file for complete search history.

(56) References Cited

U.S. PATENT DOCUMENTS 5,811,846 A * 9/1998 Miura et al. .................. 257/291

FOREIGN PATENT DOCUMENTS

| JP | 09-113931 | 5/1997 |
| JP | 2002-190598 | 7/2002 |
| JP | 2004-304084 | 10/2004 |

OTHER PUBLICATIONS

English Abstract for Publication No. 09-113931.
English Abstract for Publication No. 2002-190598.
English Abstract for Publication No. 2004-304084.

* cited by examiner

*Primary Examiner* — Thinh T Nguyen

(74) *Attorney, Agent, or Firm* — F. Chau & Associates, LLC

(57) ABSTRACT

A thin film transistor array substrate includes a gate line disposed on a substrate, the gate line comprising a gate electrode including a lower film and an upper film thicker than the lower film, a gate insulating layer formed on the gate line, a semiconductor layer formed on the gate insulating layer, an ohmic contact layer formed on the semiconductor layer, a data line electrically connected to a source electrode and a drain electrode formed on the ohmic contact layer, the lower film of the gate line is in contact with the gate insulating layer at a crossing portion of the gate line and the data line and the heights of the source electrode and the drain electrode are substantially the same as or less than a height of the semiconductor layer.

7 Claims, 14 Drawing Sheets

US 8,022,407 B2

THIN FILM TRANSISTOR ARRAY SUBSTRATE AND MANUFACTURING METHOD THEREOF

CROSS-REFERENCE TO RELATED APPLICATION

This application claims priority to Korean Patent Application No. 10-2008-0117575, filed Nov. 25, 2008, and all the benefits accruing there from, the entire contents of which are incorporated by reference.

BACKGROUND (a) Field of the Invention The present invention relates to a thin film transistor array substrate and a manufacturing method thereof.

(b) Description of Related Art

An active type display device, such as a liquid crystal display (LCD) or an organic light emitting diode (OLED) display, includes a plurality of pixels arranged in a matrix, each pixel including field generating electrodes and switching elements. The switching elements include thin film transistors (TFTs) having three terminals, a gate, a source, and a drain. The TFT of each pixel selectively transmits data signals to the field-generating electrode in response to gate signals.

The display device further includes a plurality of signal lines for transmitting signals to the switching elements. The signal lines include gate lines transmitting gate signals and data lines transmitting data signals.

Both the LCD and the OLED include an array substrate provided with respective ones of the TFTs, the field-generating electrodes, and the signal lines. The described array substrate may be referred to as a TFT array substrate.

The TFT array panel has a layered structure that includes conductive layers and insulating layers. The gate lines, the data lines, and the field-generating electrodes are formed using various conductive layers separated by insulating layers.

The TFT array panel having the layered structure is manufactured using several lithography steps followed by etching steps. Since each lithography step incurs monetary and time costs, it is desirable to reduce the number of the lithography steps used in manufacturing the TFT array panel.

SUMMARY

A thin film transistor array substrate includes a gate line disposed on a substrate, the gate line comprising a gate electrode including a lower film and an upper film thicker than the lower film, a gate insulating layer formed on the gate line, a semiconductor layer formed on the gate insulating layer, an ohmic contact layer formed on the semiconductor layer, a data line electrically connected to a source electrode and a drain electrode formed on the ohmic contact layer. The lower film of the gate line contacts the gate insulating layer at a crossing portion of the gate line and the data line. Heights of the source electrode and the drain electrode are substantially the same as or less than a height of the semiconductor layer.

A thickness of the data line at the crossing portion of the gate line and the data line is d, a thickness of the ohmic contact layer is n, and a thickness of the upper film of the gate line is t. The above d, n and t have a relation of:

$$d+n<t.$$

Planar shapes of the semiconductor layer and the ohmic contact layer are substantially the same as the data line, the source electrode and the drain electrode.

The thin film transistor array substrate further includes a passivation layer on the data line, a contact hole formed in the passivation layer and a pixel electrode electrically connected to the drain electrode through the contact hole. The passivation layer comprises at least one of an organic material and color filter material. The pixel electrode overlaps with the semiconductor layer.

The source electrode and the drain electrode overlap with the gate electrode on a sidewall of the gate electrode.

A method of manufacturing a thin film transistor array substrate includes fanning a gate line disposed on a substrate, the gate line comprising a gate electrode having a lower film and an upper film thicker than the lower film, forming a gate insulating layer, a semiconductor layer, an ohmic contact layer on the gate line, forming a data layer on the ohmic contact layer, depositing a photoresist layer on the data layer, forming a data line, a source electrode, and a drain electrode using the photoresist as a mask, controlling a height of the photoresist to be substantially the same as a height of the semiconductor layer by decreasing a thickness of the photoresist, etching a portion of data line and the ohmic contact layer between the source electrode and drain electrode, removing the photoresist on the source electrode and the drain electrode and the lower film of the gate line at a crossing portion of the gate line and a data line contacts the gate insulating layer.

A thickness of the data line at the crossing portion of the gate line and the data line is d, a thickness of the ohmic contact layer is n, and a thickness of the upper film of the gate line is t. The above d, n and t have a relation of:

$$d+n<t.$$

The semiconductors layer, the ohmic contact layer and the data line are formed by a single photoresist coating process.

The method of manufacturing a thin film transistor array substrate further includes forming a passivation layer on the data line, forming a contact hole in the passivation layer and forming a pixel electrode electrically connected to the drain electrode through the contact hole.

The passivation layer comprises at least one of an organic material and color filter material and the pixel electrode overlaps with the semiconductor layer.

The gate electrode has a taper angle of about 30~80 degrees and the source electrode and the drain electrode overlap with the gate electrode on a sidewall of the gate electrode.

BRIEF DESCRIPTION OF THE DRAWINGS

The present invention will become more apparent by describing exemplary embodiments thereof in detail with reference to the accompanying drawing in which.

DETAILED DESCRIPTION

Figure 1:
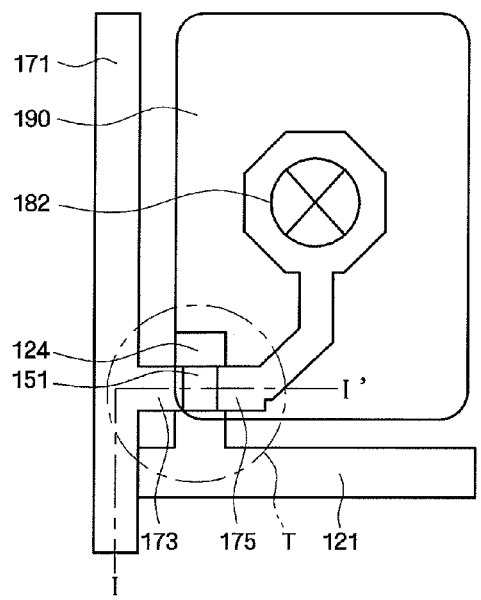
FIG. 1 is a layout view of a TFT array panel according to an exemplary embodiment of the invention.

The present invention now will be described more fully hereinafter with reference to the accompanying drawings, in which exemplary embodiments are shown. This invention may, however, be embodied in many different forms and should not be construed as limited to embodiments set forth herein.

In the drawings, the thickness of layers and regions are exaggerated for clarity. Like numerals refer to like elements throughout. It will be understood that when an element such as a layer, region or substrate is referred to as being "on" another element, the element can be directly on the other element or intervening elements may also be present. In contrast, when an element is referred to as being "directly on" another element, there are no intervening elements present.

A TFT array substrate according to an exemplary embodiment of the present invention will be described in detail with reference to FIGS. 1 and 2.

Figure 2:
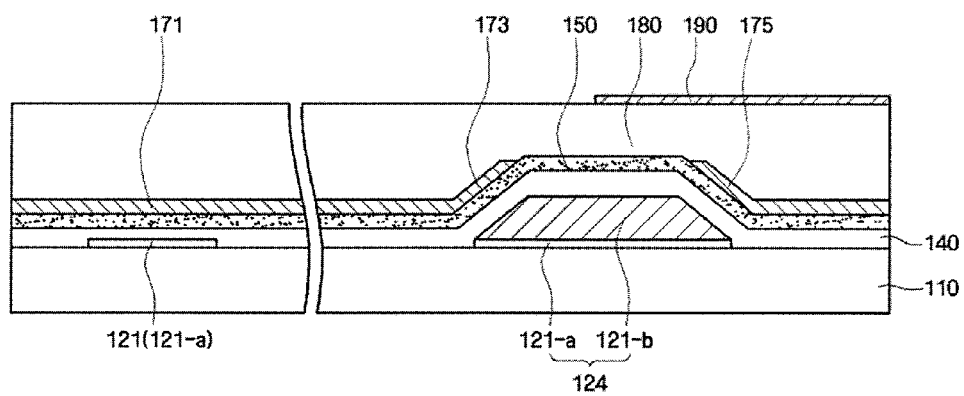
FIG. 2 is a cross sectional view of the TFT array panel shown in FIG. 1 taken along the line I-I'.

FIG. 1 is a layout view of a TFT array panel according to an exemplary embodiment of the invention, FIG. 2 is a cross sectional view of the TFT array substrate shown in FIG. 1 taken along the line I-I'.

Referring to FIG. 1, a gate line 121 crosses a data line 171. Thin film transistor (T) is connected to the gate line 121 and the data line 171, and a pixel electrode 190 is electrically connected to the thin film transistor (T).

The thin film transistor (T) includes the gate line 121, a gate electrode 124 protruding from the gate line 121, a source electrode 173 protruding from the data line 171, a drain electrode 175 separated from the source electrode 173, and a semiconductor layer 150 formed over the gate electrode 124. The pixel electrode 190 receives the data signal through a contact hole 182 in the passivation layer 180 on the drain electrode 175.

The pixel electrode 190 may overlap with the transistor (T). As showed in FIG. 1, a channel portion, an area between the source electrode and the drain electrode, of the transistor (T) overlaps with the pixel electrode 190. The pixel may not overlap with the channel portion of the transistor (T).

In FIG. 1, an ohmic contact layer (not shown) may be disposed under the source electrode 173 and drain electrode 175, on the semiconductor layer 150. The semiconductor layer 150 and the ohmic contact layer may have substantially the same planar shape as those of the data line 171, source electrode 173 and the drain electrode 175. At the channel portion of the transistor (T), the planar shape of the semiconductor and the ohmic contact layer may be different from those of the source and drain electrode.

As shown in FIG. 1, the source electrode 173 and the drain electrode 175 overlap with edge portions of the gate electrode 124. The overlapping area of the gate electrode and the source/drain electrode is small such that a parasitic capacitance can be reduced, a kickback voltage can be reduced and a display quality can be increased.

FIG. 2 is a cross sectional view of the TFT array panel shown in FIG. 1 taken along the line I-I'.

Referring to FIG. 2, the gate electrode 124 is formed on the insulating substrate 110. The gate line 121 and the gate electrode 124 may comprise, e.g., a metal comprising Al (aluminum), such as Al and Al alloy, a metal comprising Ag (silver), such as Ag and Ag alloy, a metal comprising Cu (copper), such as Cu and Cu alloy, a metal comprising Mo (molybdenum), such as Mo and Mo alloy, Cr (chromium), Ti (titanium), W (tungsten), Ta (tantalum), or alloys thereof. The gate lines 121 and gate electrode 124 may have a multi-layered structure including conductive films having different physical characteristics. A first conductive film preferably comprises a low resistive metal including a metal comprising Al, a metal comprising Ag, or a metal comprising Cu for reducing signal delay or voltage drop. A second conductive film preferably comprises a material such as a metal comprising Mo, Cr, Ta, or Ti, which have good physical, chemical, and electrical contact characteristics with other materials, such as indium tin oxide (ITO) or indium zinc oxide (IZO). Exemplary combinations of two films are a lower Cr film and an upper Al (alloy) film and a lower Al (alloy) film and an upper Mo (alloy) film. The gate lines 121 and the gate electrode 124 may comprise various metals or conductors.

As shown in FIG. 2, the gate electrode 124 may include double layered structure of a lower film 121-a and an upper film 121-b thicker than the lower film 121-a. At a crossing portion of the gate line 121 and the data line 171, the gate line 121 may be a single layer of the lower film 121-a. The gate line 121 at a crossing portion of the gate line 121 and the data line 171 and comprising the lower film 121-a may be thinner than the gate line 121 at the gate electrode 124 comprising the lower film 121-a and the upper film 121-b.

The lateral sides of the gate line 121 and the gate electrode 124 are inclined relative to a surface of the substrate 110, and the inclination angle of the sides may range from about 30 to about 80 degrees.

A gate insulating layer 140 comprising silicon nitride (SiNx) is formed on the gate line 121.

A semiconductor layer 150 comprising hydrogenated amorphous silicon (abbreviated to "a-Si") or polysilicon is formed on the gate insulating layer 140. The semiconductor layer 150 is formed on the gate electrode 124.

An ohmic contact layer (not shown) is formed on the semiconductor layer 150. The ohmic contact layer may comprise n+ hydrogenated a-Si heavily doped with an n type impurity, such as phosphorous, or the ohmic contact layer may comprise silicide. Overlapping portions of the semiconductor layer 150 and the ohmic contact layer with the gate electrode 124 are inclined relative to a surface of the substrate 110, and the inclination angles of the overlapping portions may range from about 30 to about 80 degrees.

A data line 171 includes a source electrode 173 and a drain electrode 175 separated from the source electrode 173. The source electrode 173 and the drain electrode 175 are formed on the semiconductor layer 150.

The data line 171 transmits data signals and intersects the gate line 121 (FIG. 1). The data line 171 includes an end portion having an area for contact with another layer or an external driving circuit. A data driving circuit (not shown) for generating the data signals may be mounted on a flexible printed circuit (FPC) film, which may be attached to the substrate 110, directly mounted on the substrate 110, or integrated onto the substrate 110. The data line 171 may extend to be connected to a driving circuit that may be integrated on the substrate 110.

The drain electrode 175 is separated from the source electrode 173 and disposed opposite the source electrode 173 with respect to the gate electrode 124.

A gate electrode 124, a source electrode 173, and a drain electrode 175 with the semiconductor layer 150 form the thin film transistor (T) having a channel formed at a semiconductor layer between the source electrode 173 and the drain electrode 175.

The data lines 171, source electrode 173, and the drain electrode 175 may comprise a low resistivity metal such as Ag, Au (gold), Cu, Al or a refractory metal, such as Cr, Mo, Ti, Ta, W or alloys thereof. The data line 171, source electrode 173, and the drain electrode 175 may also have a multilayered structure comprising a refractory metal film and a low resistivity metal film. Examples of a multi-layered structure are a double-layered structure including a lower Cr or Mo (alloy) film and an upper Al (alloy) film and a triple-layered structure of a lower Mo (alloy) film, an intermediate Al (alloy) film, and an upper Mo (alloy) film. The data lines 171, source electrode 173, and the drain electrodes 175 may comprise various metals or conductors.

Referring to FIG. 2, the source electrode 173 and the drain electrode 175 are overlapped with the edge portion of the gate electrode 124. The source electrode 173 and the drain electrode 175 are disposed on the inclined edge portion of the semiconductor layer 150 and the ohmic contact layer over the gate electrode 124. The height of the source electrode 173 and the drain electrode 175 overlapping with the gate electrode 124 on the gate electrode 124 is substantially the same as or less than that of the semiconductor layer 150. Due to the inclined structure, a smaller area of the gate electrode 124 overlaps with the source electrode 173 and the drain electrode 175, and smaller parasitic capacitances between the gate electrode and the source electrode and the drain electrode may be formed.

At a crossing portion of the gate line 121 and the data line 171 in FIG. 2, a gate insulating layer 140 is formed on the gate line 121 formed of the lower film 121-a thinner than the gate electrode 124 comprising the lower film 121-a and the upper film 121-b. The lower film 121-a at the crossing portion may be a single layer or a single film. The gate insulating layer 140 is in contacted with the gate line 121 at the crossing portion of the gate line 121 and the data line 171. The semiconductor layer 150 and the ohmic contact layer (not shown) may be formed on the gate insulating layer 140 at the crossing portion of the gate line 121 and the data line 171. The data line 171 may be on the semiconductor layer 150 and the ohmic contact layer (not shown).

When a thickness of the data line 171 of the crossing portion of the gate line 121 and the data line 171 is d, a thickness of the ohmic contact layer is n, and a thickness of the upper film 121-b of the gate line 121 is t. The above d, n and t have a relation of $$d+n<t.$$

When the above relation may be applied, the thickness difference between the gate electrode 124 and the crossing portion of the gate line 121 at the data line 171 is t.

The ohmic contact layer interposed between the semiconductor layer 150 and the data line 171 reduces the contact resistance therebetween. The semiconductor layer 150 has substantially the same planar shape as the data line 171 and the drain electrode 175 as well as the ohmic contact layer (not shown). The semiconductor layer 150 includes an exposed portion, which is not covered with the source electrode 173 and the drain electrode 175. The exposed portion of the semiconductor layer 150 is located between the source electrode 173 and the drain electrode 175.

A passivation layer 180 is formed on the data line 171, the source electrode 173, the drain electrode 175, and the exposed portion of the semiconductor layer 150. The passivation layer 180 may comprise an inorganic insulator such as silicon nitride or silicon oxide. Alternatively, the passivation layer 180 may comprise an organic insulator or low dielectric insulator. The organic insulator and the low dielectric insulator may have a dielectric constant less than about 4.0. The low dielectric insulator may comprise a-Si:C:O and a-Si:O:F formed by plasma enhanced chemical vapor deposition (PECVD). The organic insulator for the passivation layer 180 may have photosensitivity and the passivation layer 180 may have a substantially flat surface. The passivation layer 180 may comprise a lower film of an inorganic insulator and an upper film of an organic insulator to obtain the desirable insulating characteristics of the organic insulator while substantially preventing the exposed portions of the semiconductor layer 150 from being damaged by the organic insulator. The passivation layer 180 may comprise a color filter material.

The passivation layer 180 has the contact hole 182 exposing a portion of the drain electrode 175.

A pixel electrode 190 is formed on the passivation layer 180. The pixel electrode 190 may comprise a transparent conductor such as (amorphous) ITO or IZO or a reflective conductor such as Ag, Al, or alloys thereof. The pixel electrode 190 is physically and electrically connected to the drain electrode 175 such that the pixel electrode 190 receives data voltage from the drain electrode 175. The pixel electrode 190 supplied with the data voltage generates electric fields in cooperation with a common electrode (not shown) of an opposing display substrate (not shown) supplied with a common voltage, which determine orientations of liquid crystal molecules (not shown) of a liquid crystal layer (not shown) disposed between the pixel electrode and the common electrode on the opposing display substrate. The pixel electrode 190 and the common electrode form a capacitor referred to as a "liquid crystal capacitor," which stores applied voltages after the TFT turns off.

A method of manufacturing the TFT array substrate shown in FIGS. 1 and 2 according to an exemplary embodiment of the invention will be described in detail with reference to FIGS. 3-17.

Figure 3:
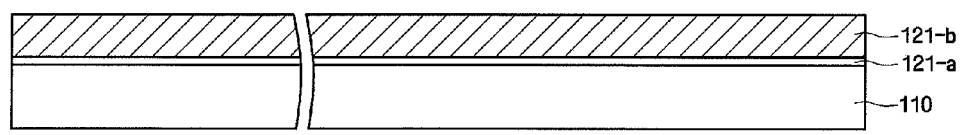
FIGS. 3 to 17 are plan views and sectional views of sequential process of the TFT array panel according to an exemplary embodiment of the present invention.
Figure 4A:
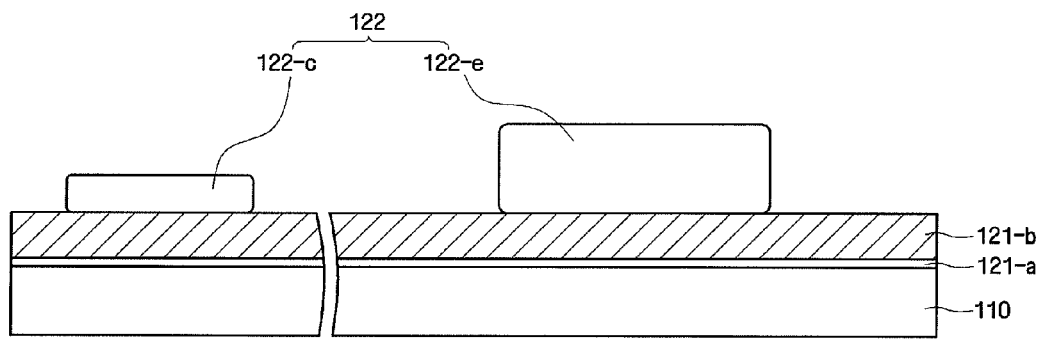
Figure 4B:
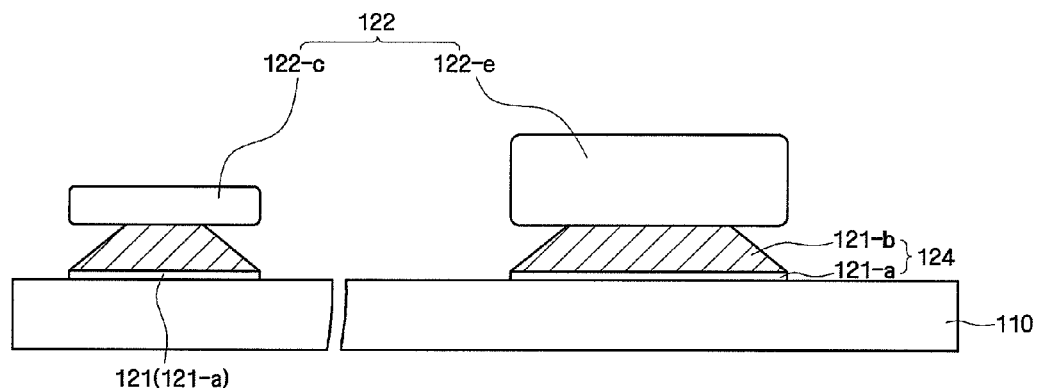
Figure 4C:
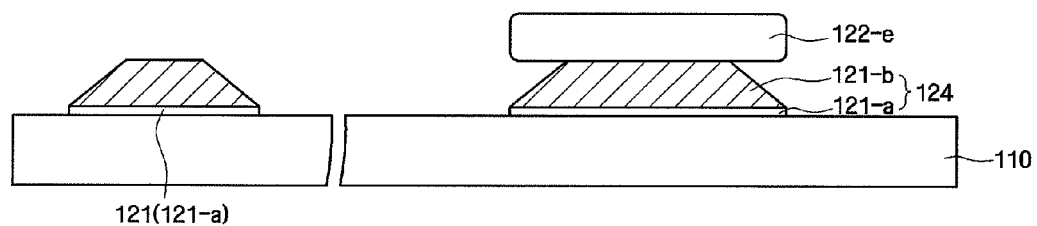
Figure 4D:
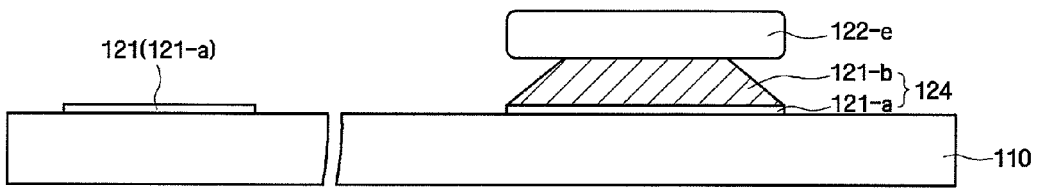
Figure 5:
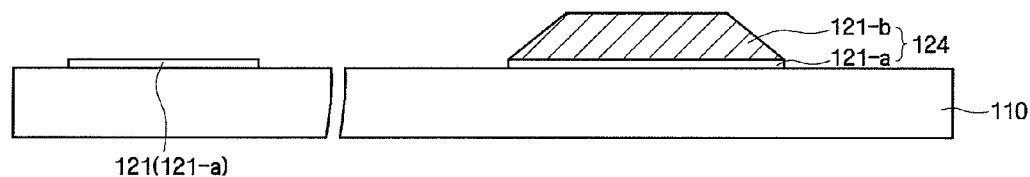

FIG. 3 is a cross sectional view of gate layer formed over the substrate. FIGS. 4A-D are cross sectional views of the photoresist on the gate layer of FIG. 3. FIG. 5 is a cross sectional view of the gate line including a gate electrode.

As shown in FIG. 3, a lower film 121-a comprising metal, such as Mo, Ti, Ta, Cr, or alloys thereof, is deposited on an insulating substrate 110 comprising transparent glass by, e.g., sputtering. The lower film 121-a may have a thickness of about 300-3,000 Å. An upper film 121-b is deposited on the lower film 121-a, and is thicker than the lower film 121-a. The upper film 121-b comprises metal, such as Al, Cu, Ag, Au or alloys thereof. A photoresist 122 is coated on the upper film 121-b. A mask is located over the photoresist 122 while the photoresist 122 is exposed to light. Two photoresist layer 122-c, 122-e of different thickness are formed on the upper film 121-b in FIG. 4A. The position-dependent thickness of the photoresist may be obtained using one of several techniques, for example, by providing translucent areas on the exposure mask as well as light transmitting areas and light blocking opaque areas. The translucent areas may have a slit pattern, a lattice pattern, a thin film(s) with intermediate transmittance, or intermediate thickness. At a crossing portion of the gate line 121 and the data line 171, a thinner photoresist 122-c is formed. A thicker photoresist 122-e is formed on the gate electrode 124. The lower film 121-a and the upper film 121-b not covered by the photoresist 122 (122-e, 122-c) are removed by an etchant (FIG. 4A). The photoresist 122 is ashed (e.g., using an etch-back process), removing the photoresist 122-c at the crossing portion of the gate line 121 and the data line and thinning the photoresist 122-e at the gate electrode 124 (FIG. 4B). The upper film 121-*b* at the crossing portion is removed by an etchant and the double-layered film (121-*a*, 121-*b*) under the thinned photoresist 122-*e* remains (FIG. 4C). FIG. 5 shows the formed gate line 121 and gate electrode 124. Using a slit mask process, the gate line 121 and gate electrode 124 having different thicknesses depending can be formed economically and simply by a single photolithography process.

Figure 6:
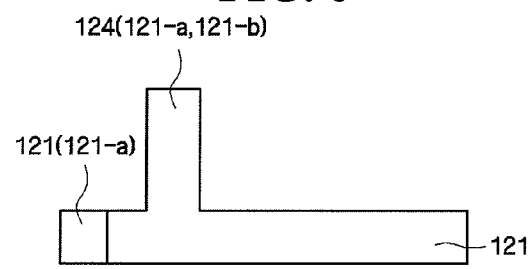

As shown in FIG. 5, the gate electrode 124 is a double layered structure and the gate line 121 on the crossing portion of the gate line 121 and the data line 171 is a single layer which is thinner than the gate electrode 124. According to an exemplary embodiment of the invention, the gate line 121 is formed using a slit mask exposure, or half toned mask exposure, on the double layered film. The gate line 121 can be formed using a slit mask exposure, or half toned mask exposure, on the single layered film or multilayered film. The thickness of the gate electrode 124 is thicker than the thickness of the gate line 121 on the crossing portion of the gate line 121 and the data line 171. FIG. 6 is a plan view of FIG. 5.

A process for forming a source electrode and a drain electrode is explained with reference to FIGS. 7 to 14.

Figure 7:
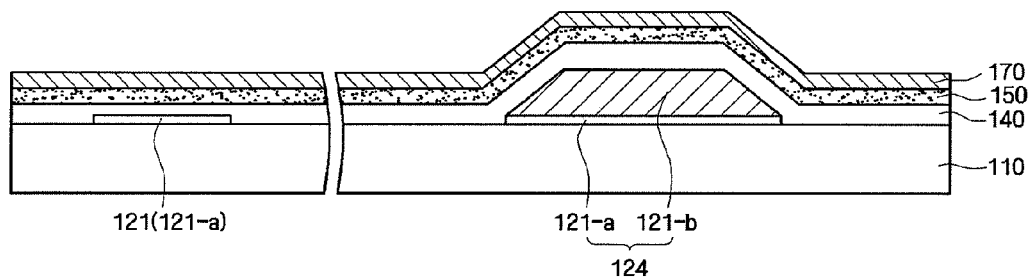

Referring to FIG. 7, a gate insulating layer 140, an intrinsic a-Si layer 150, and an extrinsic a-Si layer (not shown) are sequentially deposited using, e.g., CVD, etc. The gate insulating layer 140 may comprise silicon nitride having a thickness of about 2,000-5,000 Å. The deposition temperature of the gate insulating layer 140 may be in a range of about 250-450° C. A conductive layer 170 comprising metal is deposited on the intrinsic a-Si layer 150 using, e.g., sputtering.

Figure 8:
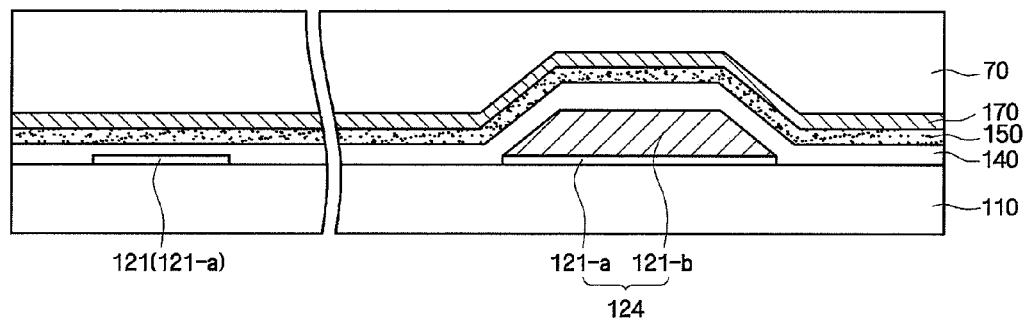

As shown in FIG. 8, a photoresist layer 70 entirely covering the conductive layer 170 on the substrate, e.g. about 2-3 microns, is coated on the conductive layer 170. The thickness of the photoresist 70 is thicker than that of the gate electrode 124. The photoresist 70 may have a planarization character.

Figure 9:
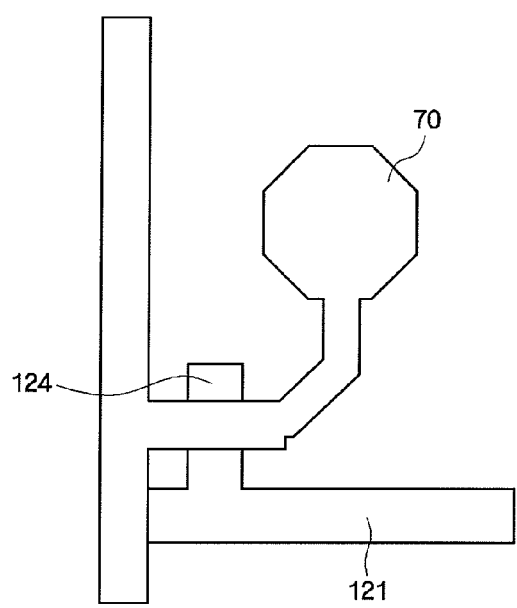

The photoresist layer 70 is exposed to light through a photo mask (not shown), and developed such that the developed photoresist is on the data line, the source electrode, the drain electrode and the channel portion as shown in FIG. 9.

Figure 10:
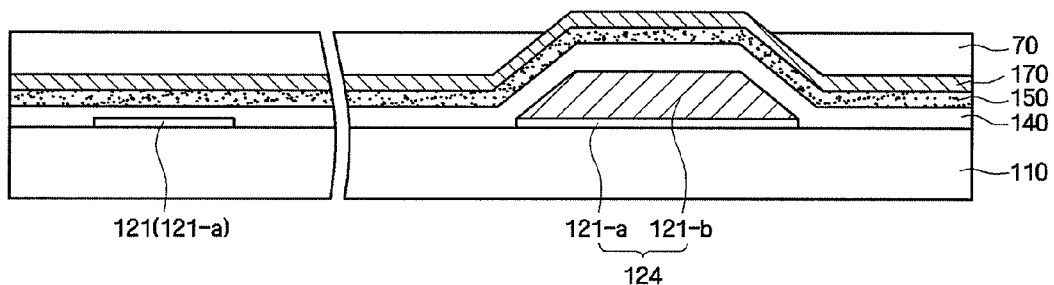
Figure 11:
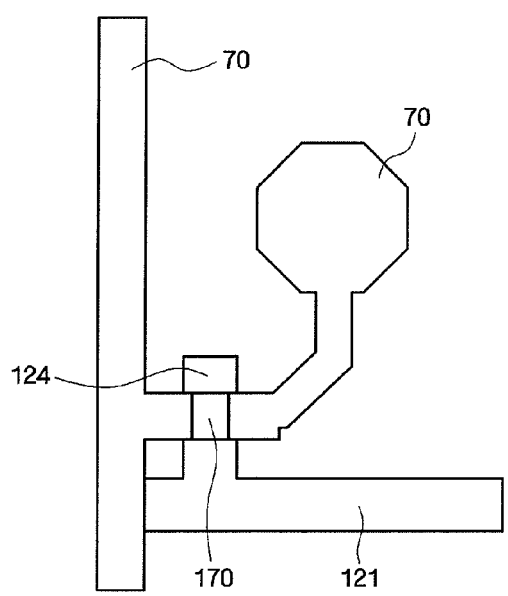

The photoresist layer 70 is partially etched. An upper portion of photoresist layer 70 is removed by the same thickness over the entire substrate through a dry etching method or developing method. Partially etched photoresist 70 may expose the conductive layer 150 corresponding to the channel portion of the thin film transistor. The thickness of the photoresist 70 is controlled to level the height of the photoresist to substantially the height of the intrinsic a-Si layer 150. FIGS. 10 and 11 show the partial etching of the photoresist to expose the conductive layer 150. The height of the partial etched photoresist 70 is substantially the same as the semiconductor layer, which is an intrinsic a-Si layer.

Figure 12:
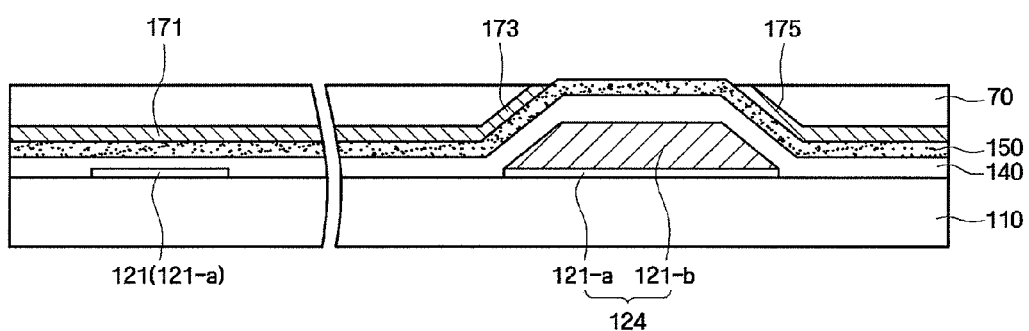
Figure 13:
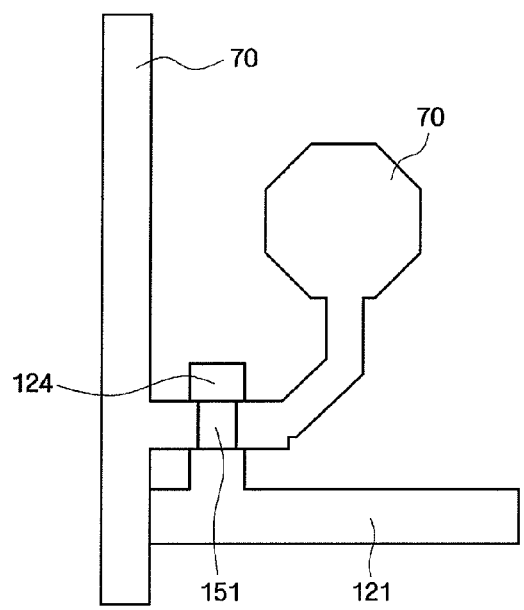
Figure 14:
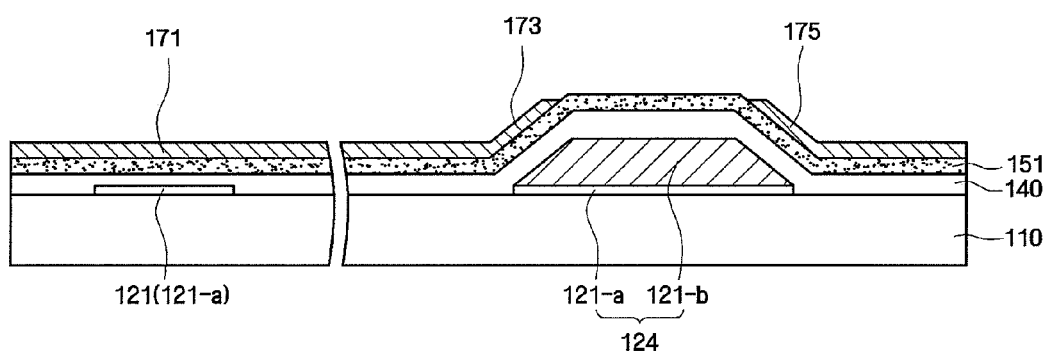
Figure 15:
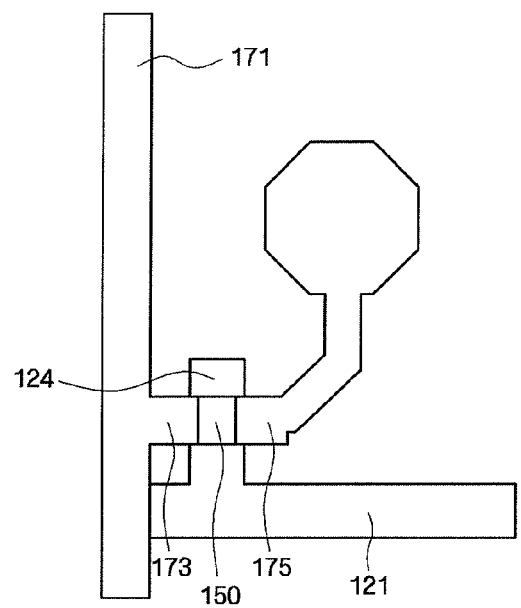

Referring to FIGS. 12 and 13, the exposed conductive layer 170 and the underlying ohmic contact layer are etched. The remaining photoresist 70 is stripped as shown in FIGS. 14 and 15. A self-aligned source electrode 173 and drain electrode 175 are formed on the gate electrode 124. End portion of the source and drain electrodes 173, 175 are located on the inclined side walls of the gate electrode 124 and the height of the source and drain electrodes is substantially the same as that of the semiconductor layer 150. Therefore, the overlapping area of the gate electrode and the source/drain electrode is relatively small and the parasitic capacitance and kickback voltage are decreased as compared to a case having a relatively large overlap.

In a self-aligned etching process of the source/drain electrode according to an exemplary embodiment of the present invention, the gate electrode is relatively thick as compared to a thickness of the gate line at the crossing portion of the gate line and the data line. Otherwise the data line at the crossing portion of the gate line and the data line may be cut off by the thickness of the underlying gate line like the channel portion between the source and drain electrode. Furthermore, according to an exemplary embodiment of the present invention, the thickness of the data line at the crossing portion of the gate line and the data line is smaller than that of the gate electrode 124 for a self-aligned etching process. A self-aligned etching process according to an exemplary embodiment of the present invention is economic and simple since an additional photoresist coating process for the channel formation is not needed.

Figure 16:
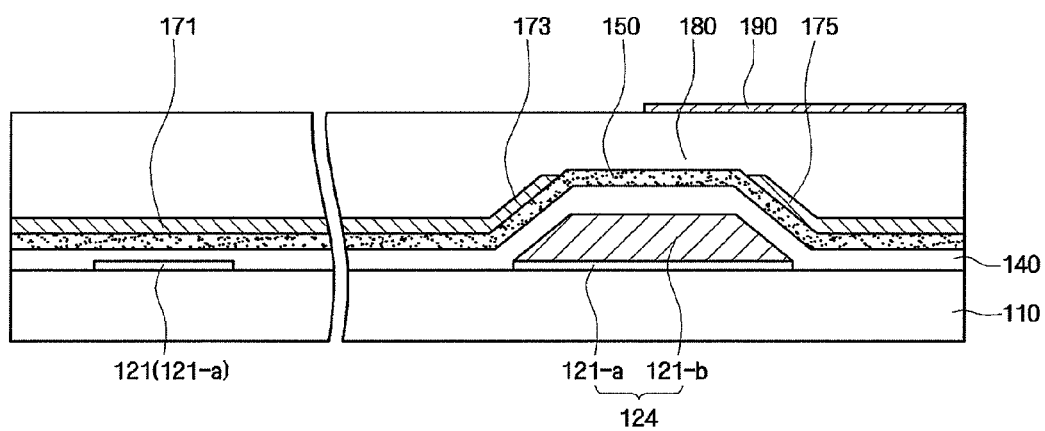
Figure 17:
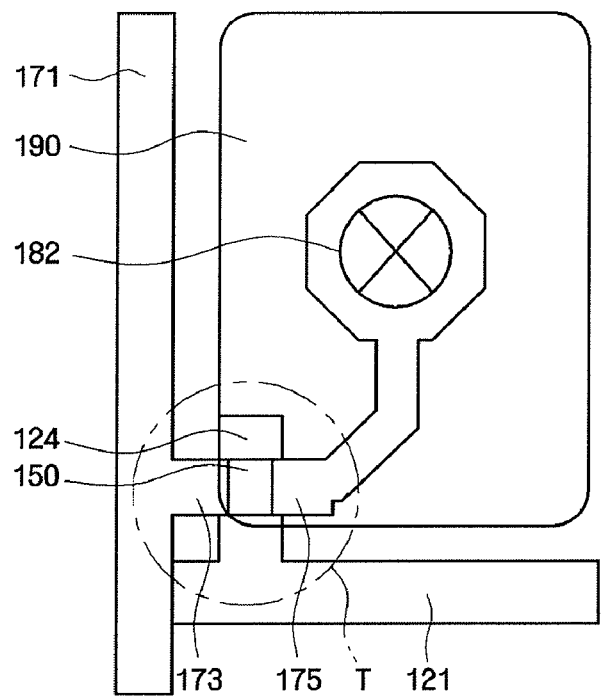

Referring to FIGS. 16 and 17, a passivation layer 180 is deposited and a pixel electrode 190 comprising a transparent conductive material such as IZO, ITO, or amorphous ITO is deposited.

The passivation layer 180 may include at least one or more of an inorganic insulator formed by a chemical vapor deposition process, an organic insulator comprising photosensitive organic material, or a color filter material. The contact hole 182 in the passivation layer 180 on the drain electrode is formed and the pixel electrode 190 is connected to the drain electrode.

A TFT array substrate according to an exemplary embodiment of the present invention will be described in detail with reference to FIGS. 18 and 19.

Figure 18:
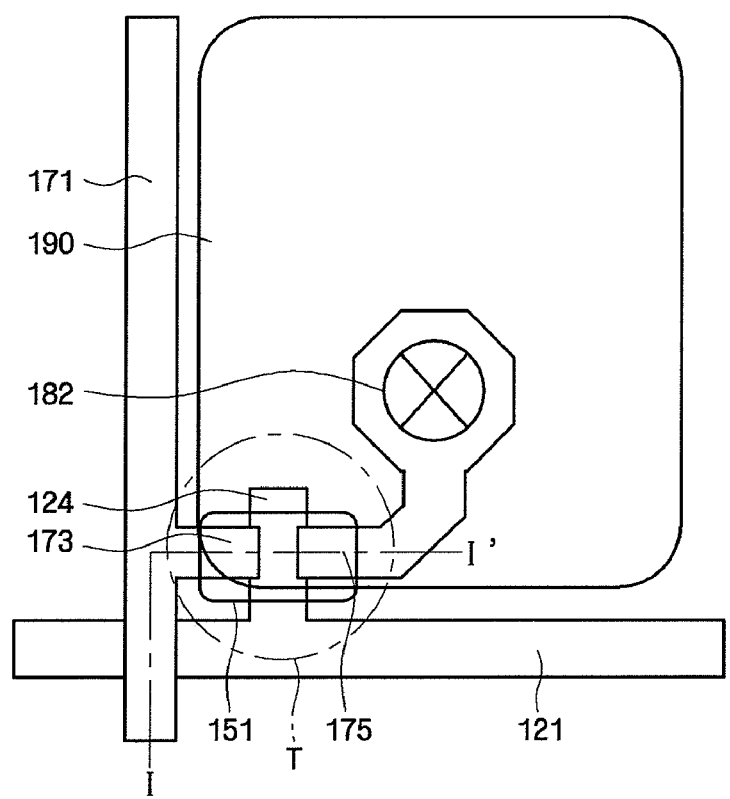
FIG. 18 is a layout view of a TFT array panel according to another exemplary embodiment of the invention.
Figure 19:
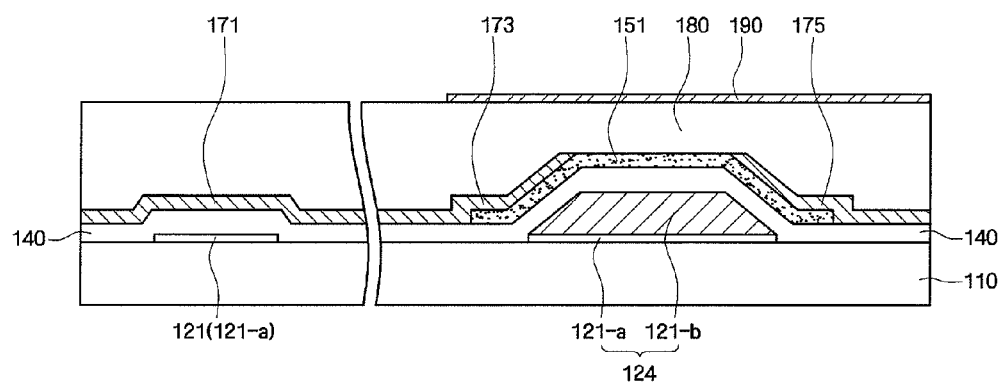
FIG. 19 is a cross sectional view of the TFT array panel shown in FIG. 18 taken along the line I-I'.

FIG. 18 is a layout view of a TFT array panel according to an exemplary embodiment of the invention, FIG. 19 is a cross sectional view of the TFT array substrate shown in FIG. 18 taken along the line I-I'.

For convenience of explanation, those members that have the same functions and that are described in FIGS. 1 to 17 are indicated by the same reference numerals and the description thereof is omitted.

Referring to FIG. 18, gate line 121 crosses data line 171. A thin film transistor (T) is connected to the gate line 121, and the data line 171 and a pixel electrode 190 are electrically connected to the thin film transistor (T).

An island semiconductor layer 151 is disposed on the gate electrode 124. The data line 171 includes a source electrode 173 and a drain electrode 175 separated from the source electrode 173. The source and drain electrodes 173, 175 are overlap an edge portion of the gate electrode 124.

FIG. 19 is a cross sectional view of the TFT array panel shown in FIG. 18 taken along the line I-I'.

Referring to FIG. 19, the gate line 121 including the gate electrode 124 is formed on the insulating substrate 110. A gate insulating layer 140, an island semiconductor layer 151 and an island ohmic contact layer (not shown) are sequentially formed on the gate line 121 and the gate electrode 124. A data line 171 including a source electrode 173 and a drain electrode 175 is formed on the semiconductor layer 151 and a passivation layer is disposed on the data line 171.

When a thickness of the data line 171 at the crossing portion of the gate line 121 and the data line 171 is d, a thickness of the island semiconductor layer 151 is a, and a thickness of an upper film 121-*b* of the gate electrode 124 is t. The above d, a and t have a relation of:

$$d < t + a.$$

The passivation layer 180 has a contact hole 182 exposing a portion of the drain electrode 175. A pixel electrode 190 is formed on the passivation layer 180.

A method of manufacturing the TFT array substrate shown in FIGS. 18 and 19 according to an exemplary embodiment of the present invention will be described in detail with reference to FIGS. 20-32.

For convenience of explanation, those members that have the same functions and that are described in FIGS. 1 to 17 are indicated by the same reference numerals and the description thereof is omitted.

Figure 20:
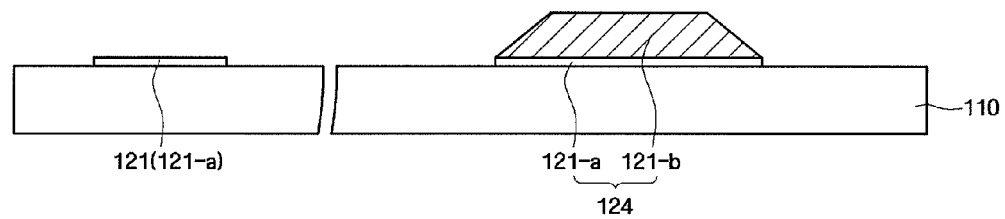
FIGS. 20 to 32 are plan views and cross sectional views of sequential process of the TFT array panel according to an exemplary embodiment of the present invention.
Figure 21:
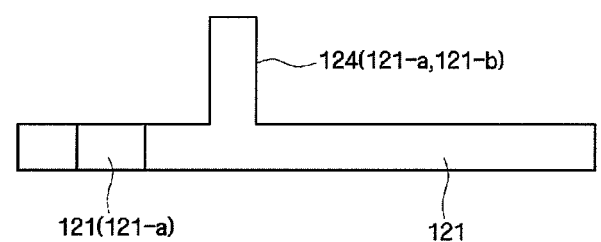
Figure 22:
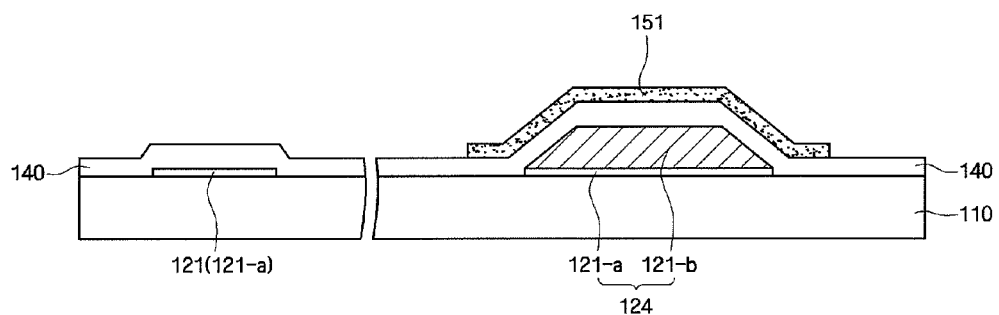
Figure 23:
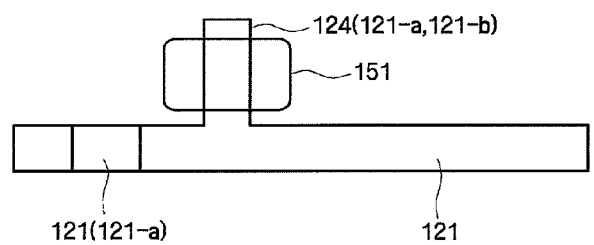
Figure 24:
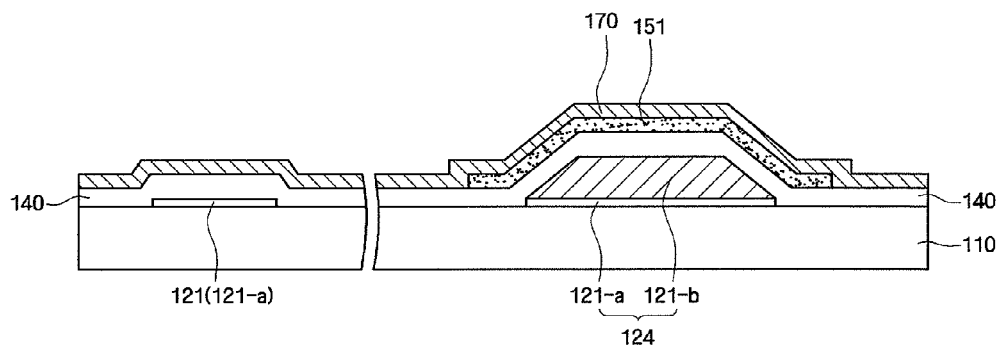

FIG. 20 is a cross sectional view of a gate line 121 and the gate electrode 124 foil led on the substrate and FIG. 21 is a plan view corresponding to FIG. 20. In FIGS. 22 and 23, a gate insulating layer 140 is formed on the substrate of FIG. 20. A semiconductor layer and an ohmic contact layer (not shown) on the semiconductor layer are deposited on the gate electrode 124 and patterned to form an island type semiconductor layer 151 and ohmic contact layer by a photolithography. A data conductive layer 170 is formed on the ohmic contact layer using, e.g., sputtering in FIG. 24.

Figure 25:
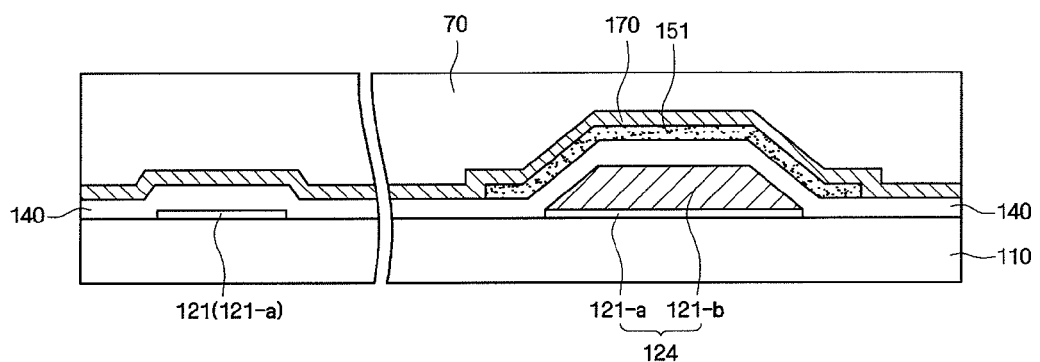

As shown in FIG. 25, a photoresist layer 70 entirely covering the conductive layer 170 on the substrate, is coated on the conductive layer 170. The thickness of the photoresist 70 is thicker than the gate electrode 124. The photoresist 70 may be planar.

Figure 26:
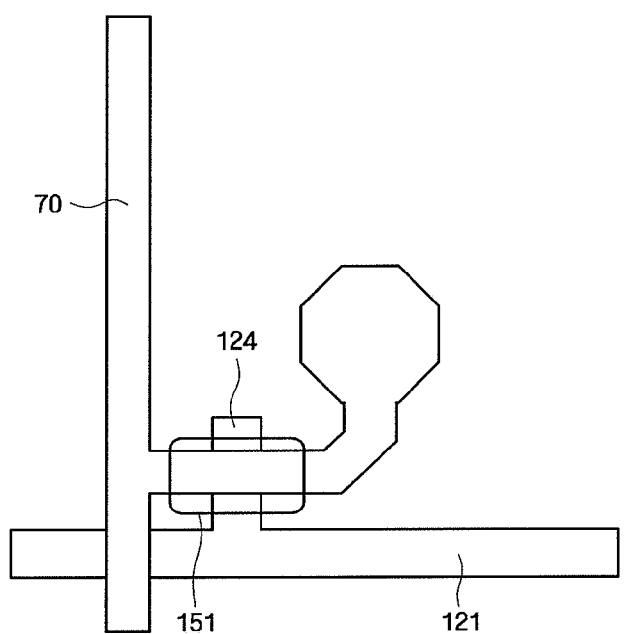

The photoresist layer 70 is exposed to light through a photo mask (not shown), and developed such that the developed photoresist is on the data line 171, the source electrode, the drain electrode and the channel portion like FIG. 26.

Figure 27:
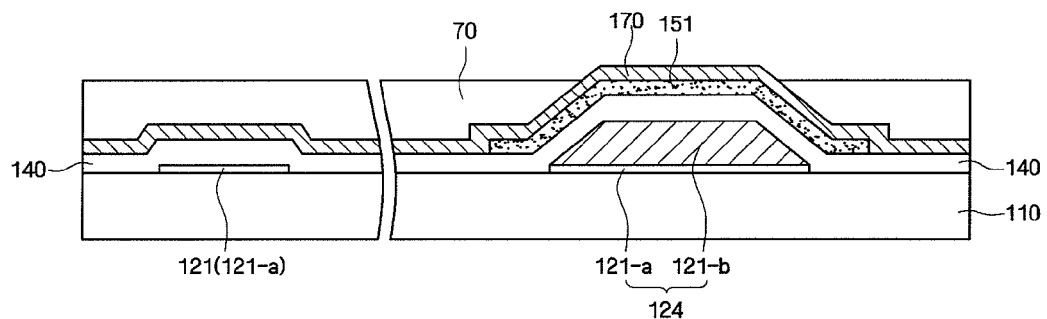
Figure 28:
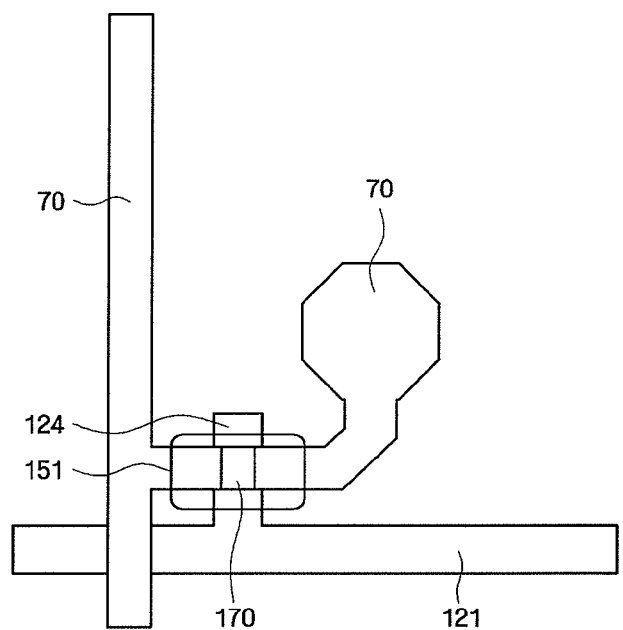

The photoresist layer 70 is partially etched. An upper portion of the photoresist layer 70 is removed by the same thickness over the entire substrate through a dry etching method or developing method. Partially etched photoresist 70 may expose the conductive layer 170 corresponding to the channel portion of the thin film transistor. The thickness of the photoresist 70 is controlled to have a height substantially equal to the height of the intrinsic a-Si layer 150. FIGS. 27 and 28 show the partial etching of the photoresist to expose the conductive layer 170. The height of the partial etched photoresist 70 is substantially the same as the semiconductor layer, which is an intrinsic a-Si layer.

Figure 29:
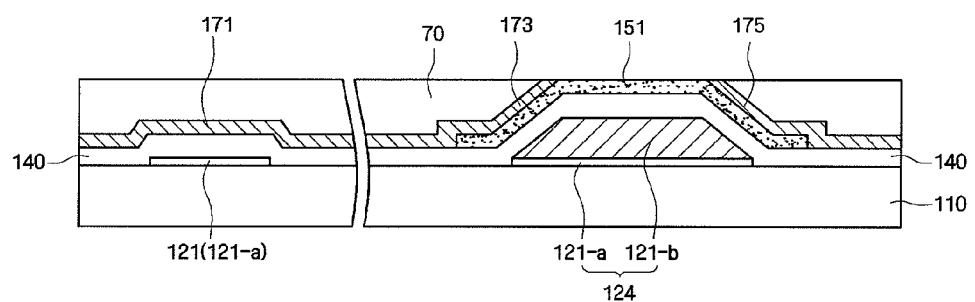
Figure 30:
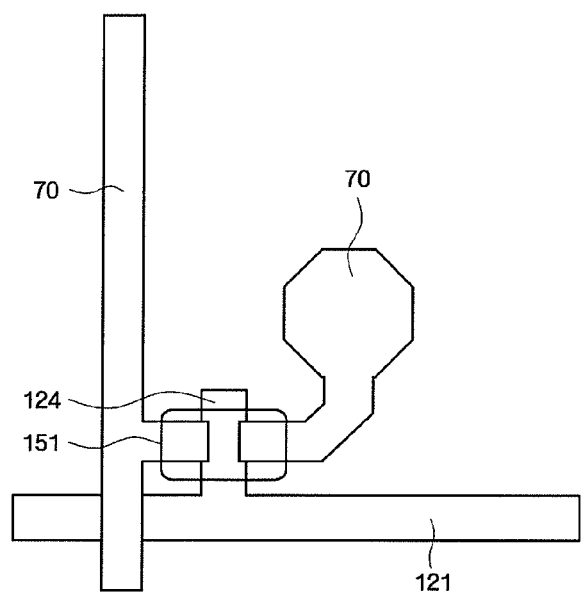

Referring to FIGS. 29 and 30, the exposed conductive layer 170 and the underlying ohmic contact layer are etched. The remaining photoresist 70 is stripped. A self-aligned source electrode 173 and drain electrode 175 are formed on the gate electrode 124. End portions of the source and drain electrode 173, 175 are located on the inclined side wall of the gate electrode 124 and the height of the source and drain electrode is substantially the same as that of the semiconductor layer 151. Therefore, an overlapping area of the gate electrode and the source/drain electrode is relatively small and a parasitic capacitance and a kickback voltage are decreased as compared to a case having a relatively large overlap.

In a self-aligned etching process of the source/drain electrode according to an embodiment of the present invention, the gate electrode is thicker than the gate line at the crossing portion of the gate line and the data line. Otherwise the data line at the crossing portion of the gate line and the data line may be cut off by the thickness of the underlying gate line like the channel portion between the source and drain electrode. Furthermore, the thickness of the data line at the crossing portion of the gate line and the data line is smaller than that of the gate electrode 124 for a self-aligned etching process. This self-aligned etching process is an economic and simple process since the additional photoresist coating process for the channel formation is not needed.

Figure 31:
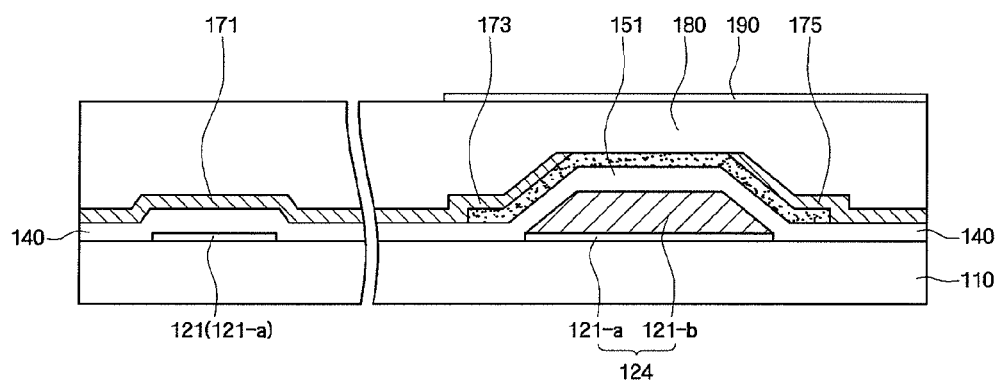
Figure 32:
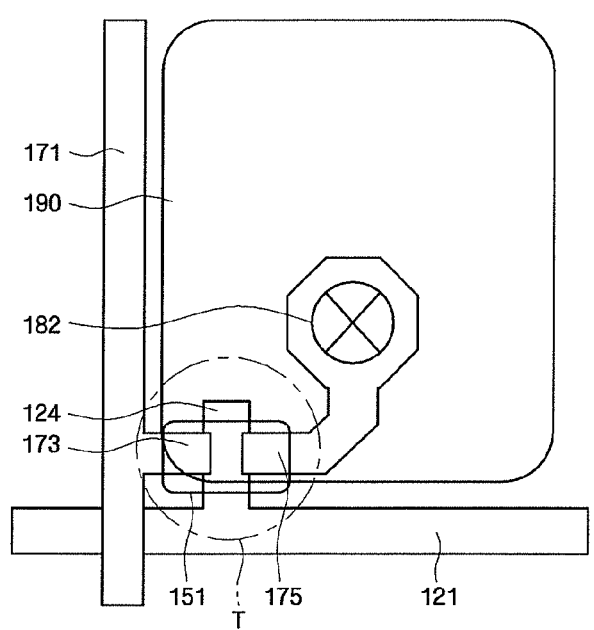

Referring to FIGS. 31 and 32, a passivation layer 180 is deposited and a pixel electrode 190 comprising a transparent conductive material such as IZO, ITO, or amorphous ITO is deposited.

The passivation layer 180 may include at least one or more of an inorganic insulator by chemical vapor deposition process, an organic insulator comprising photosensitive organic material, or a color filter material. The contact hole 182 in the passivation layer 180 on the drain electrode is formed and the pixel electrode 190 is connected to the drain electrode.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A thin film transistor array substrate comprising:
    a gate line disposed on a substrate, the gate line comprising a gate electrode including a lower film and an upper film thicker than the lower film;
    a gate insulating layer formed on the gate line;
    a semiconductor layer formed on the gate insulating layer;
    an ohmic contact layer formed on the semiconductor layer;
    a source electrode and a drain electrode formed on the ohmic contact layer, the source electrode and the drain electrode having heights substantially the same as or less than a height of the semiconductor layer; and
    a data line electrically connected to the source electrode and the drain electrode, the data line crossing the gate line at a crossing portion, and the lower film of the gate line contacting the gate insulating layer at the crossing portion.

2. The thin film transistor array substrate of claim 1, wherein a thickness of the data line at the crossing portion of the gate line and the data line is d, a thickness of the ohmic contact layer is n, and a thickness of the upper film of the gate line is t, and d, n and t have the following relation:

$$d+n<t.$$

3. The thin film transistor array substrate of claim 1, wherein planar shapes of the semiconductor layer and the ohmic contact layer are substantially the same as the data line, the source electrode and the drain electrode.

4. The thin film transistor array substrate of claim 1, further comprising:
    a passivation layer on the data line;
    a contact hole formed in the passivation layer; and
    a pixel electrode electrically connected to the drain electrode through the contact hole.

5. The thin film transistor array substrate of claim 4, wherein:
    the passivation layer comprises at least one of an organic material and color filter material.

6. The thin film transistor array substrate of claim 4, wherein the pixel electrode overlaps with the semiconductor layer.

7. The thin film transistor array substrate of claim 1, the source electrode and the drain electrode overlap with the gate electrode on a sidewall of the gate electrode.

* * * * *